(12) United States Patent
Liu et al.

(10) Patent No.: US 10,602,301 B2
(45) Date of Patent: Mar. 24, 2020

(54) AUDIO PROCESSING METHOD AND AUDIO PROCESSING DEVICE

(71) Applicant: ASUSTeK COMPUTER INC., Taipei (TW)

(72) Inventors: Yao-Jen Liu, Taipei (TW); Yen-Ming Chen, Taipei (TW); Wei-Lun Chen, Taipei (TW); Tsung-Yen Yu, Taipei (TW); Chin-Chuan Lee, Taipei (TW); Guan-De Kuo, Taipei (TW); Shao-Hsiang Chen, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 16/123,002

(22) Filed: Sep. 6, 2018

(65) Prior Publication Data

US 2019/0082284 A1    Mar. 14, 2019

(30) Foreign Application Priority Data

Sep. 12, 2017 (TW) .............................. 106131288 A

(51) Int. Cl.
*H04R 29/00* (2006.01)
*H04S 7/00* (2006.01)
(Continued)

(52) U.S. Cl.
CPC ............ *H04S 7/307* (2013.01); *H03G 5/165* (2013.01); *H04R 29/008* (2013.01); *H04R 25/505* (2013.01); *H04S 2400/13* (2013.01)

(58) Field of Classification Search
CPC ..... H04R 29/00; H04R 29/007; H04R 29/008
(Continued)

(56) References Cited

U.S. PATENT DOCUMENTS

2009/0238370 A1* 9/2009 Rumsey ................. H04R 29/00
381/58
2011/0282654 A1* 11/2011 Takechi .............. G01M 13/028
704/200.1
(Continued)

FOREIGN PATENT DOCUMENTS

CN        102184733 B    7/2012
TW         I419150 B    12/2013

OTHER PUBLICATIONS

Choi et al., Objective Measurement of Perceived Auditory Quality in Multichannel Audio Compression Coding Systems, 56 J. Audio Eng. Soc. 3 (Jan. / Feb. 2008). (Year: 2008).*
(Continued)

*Primary Examiner* — Walter F Briney, III
(74) *Attorney, Agent, or Firm* — McClure, Qualey, & Rodack, LLP

(57) ABSTRACT

An audio processing method includes the following steps: receiving audio information; capturing a square wave signal, a white signal, and a speech signal of the audio information; calculating a loudness value of the audio information; calculating a first sound quality value and a second sound quality value of the audio information by using the square wave signal, the white signal, and the speech signal of the audio information; calculating a sound quality level of the audio information by using a first calculation formula, the first calculation formula being the loudness value*[1+ (B*the first sound quality value+C*the second sound quality value)], where B and C are respectively values greater than 0 and less than 0.1; and displaying a value of the sound quality level of the audio information.

9 Claims, 3 Drawing Sheets

(51) Int. Cl.
*H03G 5/16* (2006.01)
*H04R 25/00* (2006.01)

(58) Field of Classification Search
USPC .............................................. 381/56, 58, 59
See application file for complete search history.

(56) References Cited

U.S. PATENT DOCUMENTS

2013/0272542 A1    10/2013  Tracey
2016/0037275 A1*   2/2016   Drullinger ........... H04R 29/001
                                                          381/59

OTHER PUBLICATIONS

ITU-T, P.563, Single-Ended Method for Objective Speech Quality Assessment in Narrow-Band Telephony Application (May 2004). (Year: 2004).*
Cote et al., Diagnostic Instrumental Speech Quality Assessment in a Super-Wideband Context, 60 J. Audio Eng. Soc. 156 (Mar. 2012). (Year: 2012).*
AES, Loudness Trumps Everything, 54 J. Audio Eng. Soc. 421 (May 2006). (Year: 2006).*

* cited by examiner

AUDIO PROCESSING METHOD AND AUDIO PROCESSING DEVICE

CROSS-REFERENCE TO RELATED APPLICATION

This application claims the priority benefit of Taiwan application serial No. 106131288, filed on Sep. 12, 2017. The entirety of the above-mentioned patent application is hereby incorporated by reference herein and made a part of the specification.

BACKGROUND OF THE INVENTION

Field of the Invention

This disclosure relates to an audio processing method and an audio processing device.

Description of the Related Art

People's demands for quality of audio played back by a playback apparatus are increasing critical. To satisfy people's demands, various playback apparatuses come out accordingly. However, a same audio file that played back by different playback apparatuses presents different audio quality.

Consumer experience of audio quality is different according to personal feelings. Therefore, audio quality presented by the different playback devices would differ from person to person. And further, a consumer would realize the audio quality presented by the playback device only through listening to the playback device personally. In other words, it is difficult for a consumer to realize the audio quality presented by a certain playback device without listening to it. Consequently, it is limited for a consumer to make purchasing choices to a playback device.

BRIEF SUMMARY OF THE INVENTION

This application provides an audio processing method and an audio processing device, where the audio processing device is configured to perform the audio processing method. In the audio processing method, a loudness value of a playback apparatus is calculated, and a first sound quality value and a second sound quality value of audio are calculated by playing back audio information by the playback apparatus, where the first sound quality value and the second sound quality value of the audio information are calculated by using a parameter in a captured audio signal.

Subsequently, a sound quality level of the playback apparatus is further quantified by using a calculation formula, where the loudness value is used as a primary factor of the calculation formula, and the first sound quality value and the second sound quality value are used as secondary factors of the calculation formula. In this calculation manner, because a magnitude of loudness is a primary determining factor of playback quality, an unpredicted phenomenon is prevented.

This application provides an audio processing method, including the following steps: receiving audio information by using a receiving apparatus; capturing a square wave signal, a white signal, and a speech signal of the audio information; calculating a loudness value of the audio information; calculating a first sound quality value and a second sound quality value of the audio information by using the square wave signal, the white signal, and the speech signal of the audio information; calculating a sound quality level of the audio information by using a first calculation formula, the first calculation formula being the loudness value*[1+(B*the first sound quality value+C*the second sound quality value)], where B and C are respectively values greater than 0 and less than 0.1; and displaying a value of the sound quality level of the audio information.

This application also provides an audio processing device, including a receiving apparatus, a capturing unit, a first calculation unit, and a second calculation unit. The receiving apparatus is configured to receive audio information played back by a playback apparatus. The capturing unit is electrically connected to the receiving apparatus, and configured to capture a square wave signal, a white signal, and a speech signal of the audio information.

The first calculation unit is electrically connected to the capturing unit, and configured to calculate a loudness value of the audio information, and calculate a first sound quality value and a second sound quality value of the audio information by using the square wave signal, the white signal, and the speech signal of the audio information. The second calculation unit is electrically connected to the first calculation unit, and configured to calculate a sound quality level of the audio information by using a first calculation formula, the first calculation formula being the loudness value*[1+(B*the first sound quality value+C*the second sound quality value)], where B and C are respectively values greater than 0 and less than 0.1.

DETAILED DESCRIPTION OF THE EMBODIMENTS

Figure 1:
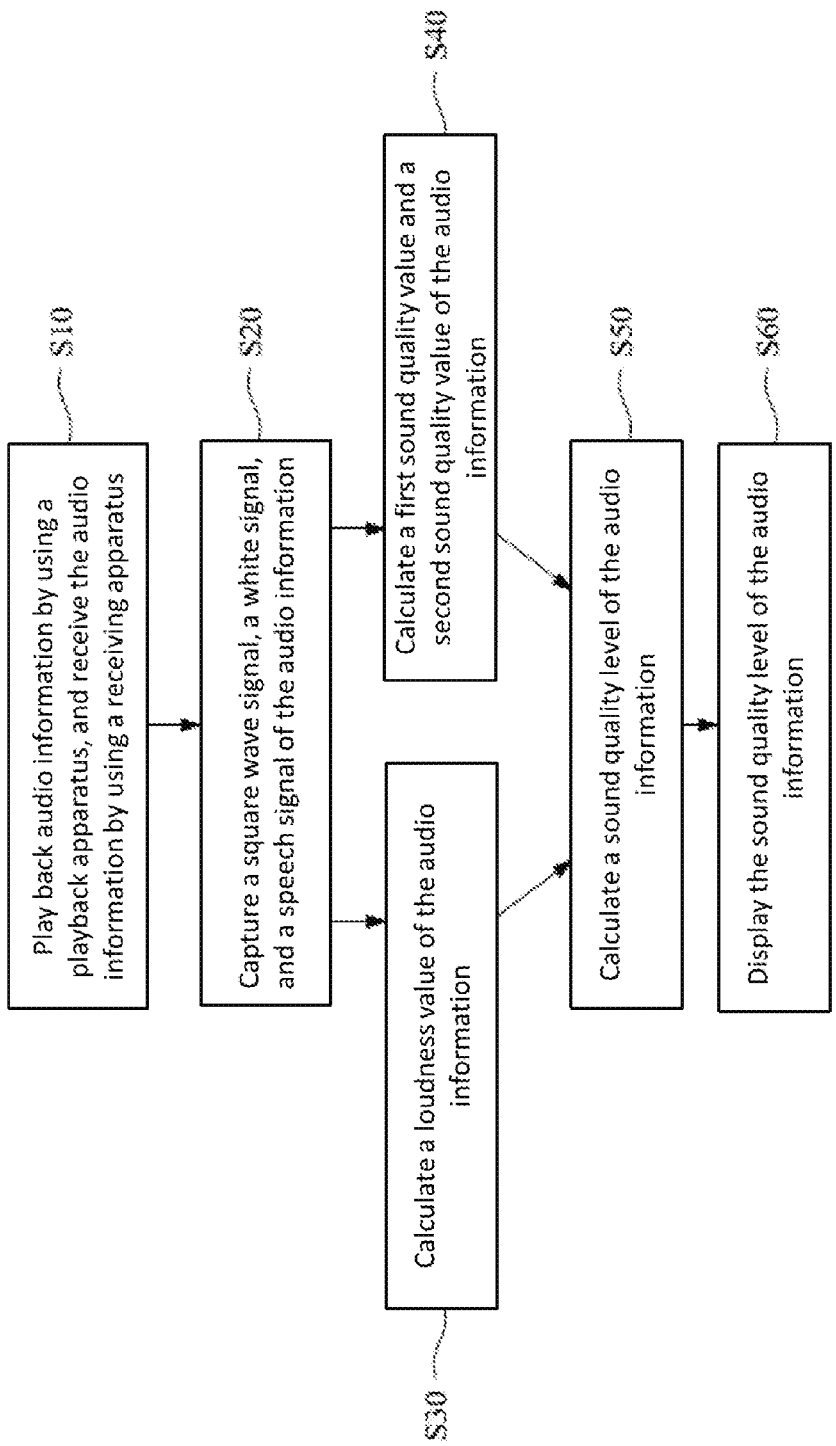
FIG. 1 is a flowchart of an audio processing method according to some implementations of this disclosure.

A plurality of implementations of this disclosure is disclosed below by using drawings, and to clarify the description, many details in practice are described together in the following description. However, it should be understood that the details in practice should not be used to limit this disclosure. To be specific, in some implementations of this disclosure, the details in practice are not necessary. In addition, to simplify the drawings, some conventional structures and elements are shown simply and schematically in the drawings.

Referring to FIG. 1 first, FIG. 1 is a flowchart of an audio processing method according to some implementations of this disclosure. In the audio processing method of this disclosure, playback quality of a playback apparatus is quantified into a numeral, and then, the playback quality of the playback apparatus is evaluated by using the quantified numeral, to compare playback performance of different playback apparatuses.

The audio processing method includes steps S10, S20, S30, S40, S50, and S60. Step S10: Play back audio information by using a playback apparatus, and receive the audio information by using a receiving apparatus. Step S20: Capture a square wave signal, a white signal, and a speech signal of the audio information. Step S30: Calculate a loudness value of the audio information. Step S40: Calculate a first sound quality value and a second sound quality value of the audio information. Step S50: Calculate a sound quality level of the audio information. Step S60: Display the sound quality level of the audio information. Contents of the steps are further described below.

Figure 2:
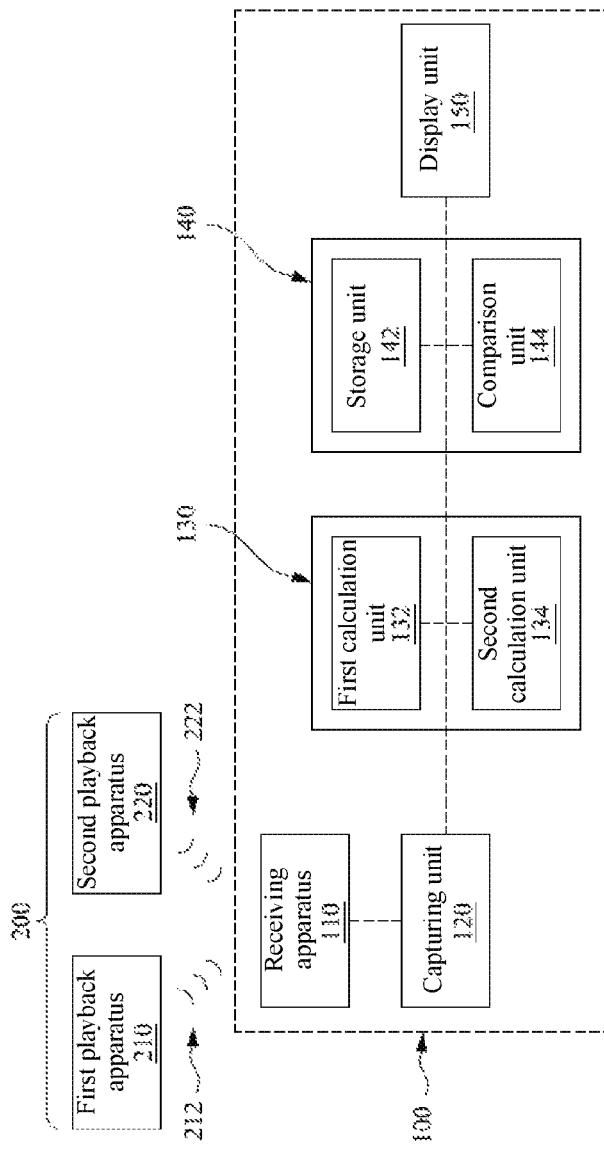
FIG. 2 is a schematic diagram of an audio processing device performing an audio processing method according to some implementations of this disclosure.

Referring to FIG. 1 and FIG. 2 together, FIG. 2 is a schematic diagram of an audio processing device 100 performing an audio processing method according to some implementations of this disclosure. The audio processing device 100 is configured to perform the foregoing steps, and includes a receiving apparatus 110, a capturing unit 120, calculator 130, a controller 140, and a display unit 150, where the capturing unit 120 is electrically connected to the receiving apparatus 110, the calculator 130 is electrically connected to the capturing unit 120, and the controller 140 is electrically connected to the calculator 130.

In step S10, an audio file is produced first. The audio file is designed according to requirements. In an embodiment, a voice portion of the audio file is enhanced, to facilitate subsequently quantifying a voice portion in audio quality. Subsequently, the audio file is input to respective playback apparatuses 200, and audio quality of the playback apparatuses 200 is sequentially quantified into numerals. Specifically, audio information 212 is first played back by a first playback apparatus 210. When the first playback apparatus 210 plays back the audio information 212, the receiving apparatus 110 of the audio processing device 100 is configured to receive the audio information 212 played back by the first playback apparatus 210.

In step S20, after the receiving apparatus 110 receives the audio information 212 played back by the first playback apparatus 210, the receiving apparatus 110 records a content of the audio information 212, and sends the content of the audio information 212 to the capturing unit 120. The capturing unit 120 is configured to capture a square wave signal, a white signal, and a speech signal of the audio information 212 from the content of the received audio information 212, and send the captured square wave signal, white signal, and speech signal to the calculator 130. The calculator 130 includes a first calculation unit 132 and a second calculation unit 134 electrically connected to each other. Steps S30 and S40 follow step S20, and steps S30 and S40 is performed synchronously.

In step S30, the first calculation unit 132 of the calculator 130 is configured to calculate the loudness value of the audio information 212. A calculation manner of the loudness value of the audio information 212 is obtained by calculating the square wave signal, the white signal, and the speech signal of the audio information 212. In an embodiment, the calculation manner of the audio information 212 is (a value A*the square wave signal+a value B*the white signal+a value C*the speech signal), where the value A+the value B+the value C=1, and the value A, the value B, and the value C are values greater than 0 and less than 1.

In step S40, the first calculation unit 132 of the calculator 130 is configured to calculate a first sound quality value and a second sound quality value of the audio information 212. The first sound quality value and the second sound quality value are considered to be quantified values of quality of the first playback apparatus 210 playing back the audio information 212 in different scenarios or conditions. In an embodiment, the first sound quality value is a quantified value of quality of the first playback apparatus 210 playing back the audio information 212 in a music playback scenario, and the second sound quality value is a quantified value of quality of the first playback apparatus 210 playing back the audio information 212 in a film playback scenario.

Figure 3:
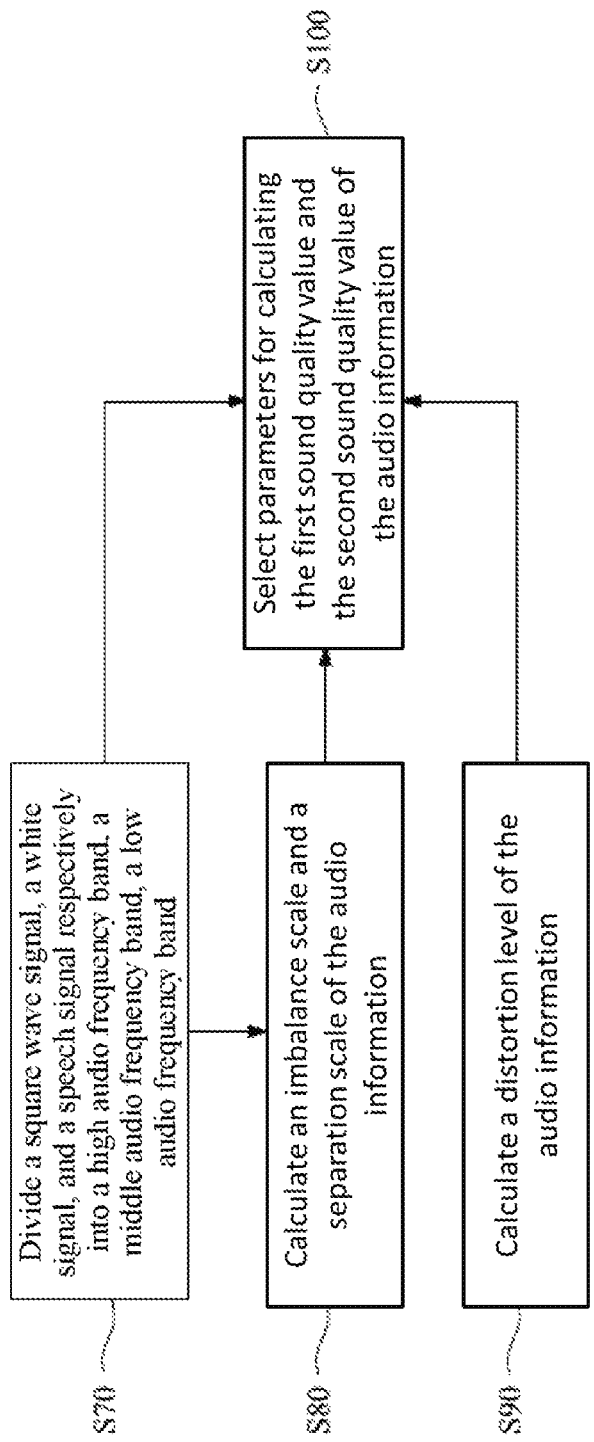
FIG. 3 is flowchart of calculating a first sound quality value and a second sound quality value of a audio information.

The first sound quality value and the second sound quality value of the audio information 212 are calculated by using a plurality of parameters. Further, referring to FIG. 2 and FIG. 3 together, FIG. 3 is flowchart of calculating the first sound quality value and the second sound quality value of the audio information 212. The calculating the first sound quality value and the second sound quality value of the audio information 212 includes steps S70, S80, S90, and S100. Step S70: Divide the square wave signal, the white signal, and the speech signal respectively into a high audio frequency band, a middle audio frequency band, a low audio frequency band. Step S80: Calculate an imbalance scale and a separation scale of the audio information 212. Step S90: Calculate a total harmonic distortion value and a second harmonic value of the audio information 212. Step S100: Select parameters for calculating the first sound quality value and the second sound quality value of the audio information 212.

In step S70, the first calculation unit 132 of the calculator 130 is configured to divide the square wave signal into a square wave signal high audio frequency band, a square wave signal middle audio frequency band, and a square wave signal low audio frequency band; divide the white signal into a white signal high audio frequency band, a white signal middle audio frequency band, and a white signal low audio frequency band; and divide the speech signal into a speech signal high audio frequency band, a speech signal middle audio frequency band, and a speech signal low audio frequency band.

In step S80, the first calculation unit 132 of the calculator 130 is configured to calculate an imbalance scale and a separation scale of the audio information 212 by using first sound channel information and second sound channel information respectively included by the square wave signal, the white signal, and the speech signal, where the first sound channel information and the second sound channel information may respectively left sound channel information and right sound channel information of the audio information 212.

In the step of calculating the imbalance scale of the audio information 212, the respective frequency bands divided in step S60 are added to a calculation formula, where imbalance scales of the different frequency bands are separately calculated. In an embodiment, a calculation manner for obtaining an imbalance scale of a low audio frequency band is adding up first sound channel information respectively included by the square wave signal low audio frequency band, the white signal low audio frequency band, and the speech signal low audio frequency band into a value D, adding up second sound channel information respectively included by the square wave signal low audio frequency band, the white signal low audio frequency band, and the speech signal low audio frequency band into a value E, and then, further calculating a difference between the values D and E.

A calculation manner for obtaining an imbalance scale of a middle audio frequency band is adding up first sound channel information respectively included by the square wave signal middle audio frequency band, the white signal middle audio frequency band, and the speech signal middle audio frequency band into a value F, adding up second sound channel information respectively included by the square wave signal middle audio frequency band, the white signal middle audio frequency band, and the speech signal middle audio frequency band into a value G, and then, further calculating a difference between the values F and G.

A calculation manner for obtaining an imbalance scale of a high audio frequency band is adding up first sound channel information respectively included by the square wave signal high audio frequency band, the white signal high audio frequency band, and the speech signal high audio frequency band into a value H, adding up second sound channel information respectively included by the square wave signal high audio frequency band, the white signal high audio frequency band, and the speech signal high audio frequency band into a value I, and then, further calculating a difference between the values H and I. In an embodiment, a unit of the foregoing differences is a decibel (dB).

In the step of calculating the separation scale of the audio information 212, the separation scale is obtained by using an average of signal-to-noise ratios of the sound channel information and the second sound channel information of the audio information 212. In an embodiment, a unit of the signal-to-noise ratios is a dB.

In step S90, the first calculation unit 132 of the calculator 130 calculates a distortion level of the audio information 212 by calculating the total harmonic distortion value and the second harmonic value of the audio information 212. In an embodiment, a unit of the total harmonic distortion value and the second harmonic value of the audio information 212 is a dB. With regard to the calculated total harmonic distortion value, a noise cleanliness level of the first playback apparatus 210 is learned from the value. A higher decibel of the value indicates that a sound breaking or distortion phenomenon occurs in the first playback apparatus 210. With regard to the calculated second harmonic value, a higher decibel of the value indicates that a volume of the first playback apparatus 210 at a low frequency is increased.

After steps S70, S80, and S90 are completed, step S100 is performed. In step S100, the first calculation unit 132 of the calculator 130 selects parameters from the square wave signal high audio frequency band, the square wave signal middle audio frequency band, the square wave signal low audio frequency band, the white signal high audio frequency band, the white signal middle audio frequency band, the white signal low audio frequency band, the speech signal high audio frequency band, the speech signal middle audio frequency band, the speech signal low audio frequency band, the difference between the values D and E, the difference between the values F and G, and the difference between the values H and I, and the separation scale, the total harmonic distortion value, and the second harmonic value of the audio information 212 for calculating the first sound quality value and the second sound quality value.

In other words, the foregoing parameters are selected according to different requirements and added into calculation formulas of the first sound quality value and the second sound quality value. In an embodiment, in some implementations, one of the first sound quality value and the second sound quality value is calculated by selecting all of the foregoing parameters, where a total weight of the parameters is 1. However, this disclosure is not limited thereto. In some implementations, one of the first sound quality value and the second sound quality value is calculated by selecting some of the foregoing parameters.

In some implementations, when the imbalance scale and the separation scale of the audio information 212 are added to parameters for calculating the first sound quality value and the second sound quality value of the audio information 212, values of the imbalance scale and the separation scale are positively correlated with values of the first sound quality value and the second sound quality value. To be specific, when the imbalance scale and the separation scale are added into calculation, the calculation is addition.

In some implementations, when the total harmonic distortion value and the second harmonic value of the audio information 212 are added to parameters for calculating the first sound quality value and the second sound quality value of the audio information 212, the total harmonic distortion value is negatively correlated to the first sound quality value and the second sound quality value, and the second harmonic value is positively correlated with the first sound quality value and the second sound quality value. To be specific, when the total harmonic distortion value is added into calculation, the calculation is subtraction, and when the second harmonic value is added into calculation, the calculation is addition.

In some implementations, when the square wave signal, the white signal, and the speech signal (including its high, middle, and low audio frequency bands) are added into parameters for calculating the first sound quality value and the second sound quality value of the audio information 212, a weight of the speech signal (including its high, middle, and low audio frequency bands) is greater than weights of the square wave signal and the white signal. To be specific, when the square wave signal, the white signal, and the speech signal are added into calculation, a coefficient of the speech signal is greater than coefficients of the square wave signal and the white signal, where the coefficients of the square wave signal, the white signal, and the speech signal are all values between 0 and 1.

In some implementations, same parameters is selected as parameters used for calculating the first sound quality value and parameters used for calculating second sound quality value, and weight distribution of the parameters used for calculating the first sound quality value is different from weight distribution of the parameters used for calculating the second sound quality value. To be specific, parameters of calculation formula for the first sound quality value are the same as parameters of the calculation formula for the second sound quality value, but the parameters are different in terms of coefficient distribution.

Referring to FIG. 1 and FIG. 2 again, after the loudness value, the first sound quality value, and the second sound quality value are obtained, step S50 is performed. In step S50, the foregoing first sound quality value and second sound quality value calculated by the first calculation unit 132 are sent to the second calculation unit 134, where the second calculation unit 134 is configured to calculate a sound quality level of the audio information 212.

Specifically, the second calculation unit 134 calculates the sound quality level of the audio information 212 by a calculation formula, where the calculation formula for the sound quality level of the audio information 212 is: (the loudness value*[1+(a value J*the first sound quality value+a value K*the second sound quality value)], where the values J and K are respectively values greater than 0 and less than 0.1. To be specific, the foregoing respective values calculated by the first calculation unit 132 is integrated by the second calculation unit 134 into a numeral, and the numeral is positively correlated with the playback quality of the first playback apparatus 210. In addition, in a calculation formula for the audio quality level, the loudness value is used as a primary factor of the calculation formula, and the first sound quality value and the second sound quality value are used as secondary factors of the calculation formula.

In this calculation manner, because a magnitude of loudness of the first playback apparatus 210 is a primary determining factor of playback quality, an unpredicted phenomenon is prevented. In an embodiment, even if performance of the first playback apparatus 210 other than the loudness value has a good quantified value, if a quantified value of the loudness value is relatively low, an overall sound quality level is also relatively low, to prevent a phenomenon that even if a quantified value is good, but a volume cannot satisfy a consumer.

On the other hand, because the total harmonic distortion value and the second harmonic value of the audio information 212 can also be added into parameters for calculating the first sound quality value and the second sound quality value, a situation in which the loudness value is relatively high, but there is a sound breaking phenomenon is prevented from being evaluated as good playback quality.

After the second calculation unit 134 quantifies the playback quality of the first playback apparatus 210 into a numeral, the second calculation unit 134 can send the quantified numeral to the controller 140. The controller 140 a storage unit 142 and a comparison unit 144 electrically connected to each other. The storage unit 142 is electrically connected to the second calculation unit 134 and configured to store a quantified sound quality level sent from the second calculation unit 134. After the sound quality level of the first playback apparatus 210 is quantified, a sound quality level of a second playback apparatus 220 is subsequently quantified. An audio file used by the second playback apparatus 220 for playing back a audio information 222 is the same as the audio file used by the first playback apparatus 210. The quantified sound quality level of the second playback apparatus 220 is further stored by the storage unit 142.

The comparison unit 144 is electrically connected to the storage unit 142, and configured to compare the sound quality levels of different playback apparatuses. In an embodiment, the comparison unit 144 is configured to compare values of the sound quality levels of the first playback apparatus 210 and the second playback apparatus 220 and generate a comparison result.

After the comparison result is generated, step S60 is performed. In step S60, the value of the sound quality level calculated by playing back the audio information 212 by the first playback apparatus 210 with the value of the sound quality level calculated by playing back the audio information 222 by the second playback apparatus 220 are displayed.

The display unit 150 is electrically connected to the storage unit 142 and comparison unit 144, and configured to display the foregoing related information. In an embodiment, the display unit 150 is configured to after the sound quality level of the first playback apparatus 210 is quantified, display a quantified value of the sound quality level of the first playback apparatus 210. Similarly, the display unit 150 is configured to after the sound quality level of the second playback apparatus 220 is quantified, display a quantified value of the sound quality level of the second playback apparatus 220. In addition, the display unit 150 is also configured to display a comparison result generated by the comparison unit 144. In an embodiment, the display unit 150 directly displays one with better playback performance.

In the foregoing audio processing method, audio playback quality of the first playback apparatus 210 and the second playback apparatus 220 is evaluated according to the comparison result generated by the comparison unit 144. To be specific, a same audio file is played back by using the first playback apparatus 210 and the second playback apparatus 220, the audio processing device 100 separately quantifies their sound quality levels, and separately generates a comparison result for their sound quality levels, so as to learn a difference between the first playback apparatus 210 and the second playback apparatus 220 in playback performance.

Although in the foregoing description, the sound quality levels of the first playback apparatus 210 and the second playback apparatus 220 are compared, in other implementations, more than two playback apparatuses can alternatively be compared, where the more than two playback apparatuses all play back a same audio file.

In conclusion, this application provides an audio processing method and an audio processing device, where the audio processing device is configured to perform the audio processing method. In the audio processing method, a loudness value of a playback apparatus is calculated, and a first sound quality value and a second sound quality value of audio are calculated by playing back audio information by the playback apparatus, where the first sound quality value and the second sound quality value of the audio information are calculated by using a parameter in a captured audio signal.

Subsequently, a sound quality level of the playback apparatus is further quantified by using a calculation formula, where the loudness value is used as a primary factor, and the first sound quality value and the second sound quality value are used as secondary factors of the calculation formula. In this calculation manner, because a magnitude of loudness is a primary determining factor of playback quality, an unpredicted phenomenon is prevented.

Although this disclosure is disclosed as above using various implementations, the implementations are not intended to limit this disclosure. Any person skilled in the art may make various variations or modifications without departing from the spirit and scope of this disclosure. Therefore, the protection scope of this disclosure shall be subject to the protection scope of the appended claims.

What is claimed is:

1. An audio processing method, comprising:
    receiving audio information;
    capturing a square wave signal, a white signal, and a speech signal of the audio information;
    calculating a total harmonic distortion value and a second harmonic value of the audio information;
    calculating a loudness value of the audio information;
    calculating a first sound quality value and a second sound quality value of the audio information by using the square wave signal, the white signal, the speech signal, the total harmonic distortion value and the second harmonic value of the audio information, wherein the total harmonic distortion value is negatively correlated to the first sound quality value and the second sound quality value, and the second harmonic value is positively correlated with the first sound quality value and the second sound quality value;
    calculating a sound quality level of the audio information by using a first calculation formula, the first calculation formula being the loudness value*[1+(B*the first sound quality value+C*the second sound quality value)], wherein B and C are respectively values greater than 0 and less than 0.1; and
    displaying a value of the sound quality level of the audio information.

2. The audio processing method according to claim 1, further comprising:
    playing back the audio information by using a first playback apparatus, and displaying the value of the sound quality level calculated by playing back the audio information by the first playback apparatus;
    playing back the audio information by using a second playback apparatus, and displaying the value of the sound quality level calculated by playing back the audio information by the second playback apparatus; and comparing the value of the sound quality level calculated by playing back the audio information by the first playback apparatus with the value of the sound quality level calculated by playing back the audio information by the second playback apparatus and generating a comparison result.

3. The audio processing method according to claim 2, further comprising:

displaying the comparison result, and evaluating playback audio quality of the first playback apparatus and the second playback apparatus by using the comparison result.

4. The audio processing method according to claim 1, wherein the step of calculating the loudness value of the audio information further comprises:

calculating the loudness value of the audio information by using a second calculation formula, the second calculation formula being D*the square wave signal+E*the white signal+F*the speech signal, wherein D+E+F=1, and D, E, and F are respectively values greater than 0 and less than 1.

5. The audio processing method according to claim 1, further comprising:

calculating an imbalance scale and a separation scale of the audio information by using first sound channel information and second sound channel information respectively comprised by the square wave signal, the white signal, and the speech signal; and adding the imbalance scale and the separation scale of the audio information to parameters for calculating the first sound quality value and the second sound quality value of the audio information, wherein values of the imbalance scale and the separation scale are positively correlated with values of the first sound quality value and the second sound quality value.

6. The audio processing method according to claim 1, wherein the step of calculating the first sound quality value and the second sound quality value of the audio information comprises:

dividing the square wave signal into a square wave signal high audio frequency band, a square wave signal middle audio frequency band, and a square wave signal low audio frequency band; dividing the white signal into a white signal high audio frequency band, a white signal middle audio frequency band, and a white signal low audio frequency band; dividing the speech signal into a speech signal high audio frequency band, a speech signal middle audio frequency band, and a speech signal low audio frequency band; and selecting and adding at least one of the square wave signal high audio frequency band, the square wave signal middle audio frequency band, the square wave signal low audio frequency band, the white signal high audio frequency band, the white signal middle audio frequency band, the white signal low audio frequency band, the speech signal high audio frequency band, the speech signal middle audio frequency band, and the speech signal low audio frequency band into parameters for calculating the first sound quality value and the second sound quality value of the audio information.

7. An audio processing device, comprising:

a receiving apparatus, configured to receive audio information played back by a playback apparatus;

a capturing circuit, electrically connected to the receiving apparatus, and configured to capture a square wave signal, a white signal, and a speech signal of the audio information;

a first calculator, electrically connected to the capturing circuit, and configured to calculate a loudness value, a total harmonic distortion value and a second harmonic value of the audio information, and calculate a first sound quality value and a second sound quality value of the audio information by using the square wave signal, the white signal, the speech signal, the total harmonic distortion value and the second harmonic value of the audio information, wherein the total harmonic distortion value is negatively correlated to the first sound quality value and the second sound quality value, and the second harmonic value is positively correlated with the first sound quality value and the second sound quality value; and a second calculator, electrically connected to the first calculator, and configured to calculate a sound quality level of the audio information by using a first calculation formula, the first calculation formula being the loudness value*[1+(B*the first sound quality value+C*the second sound quality value)], wherein B and C are respectively values greater than 0 and less than 0.1.

8. The audio processing device according to claim 7, further comprising:

a storage apparatus, electrically connected to the second calculator and configured to store the sound quality level; and a comparator, electrically connected to the storage apparatus, and configured to compare the sound quality level with a value of another sound quality level.

9. The audio processing device according to claim 8, further comprising:

a display, electrically connected to the comparator, and configured to display a result of comparison between the sound quality level and the value of another sound quality level.

* * * * *